United States Patent
Uehara et al.

(10) Patent No.: US 8,483,645 B2
(45) Date of Patent: Jul. 9, 2013

(54) DUAL CARRIER AMPLIFIER CIRCUITS AND METHODS

(75) Inventors: Gregory Uehara, Austin, TX (US); Xiaohua Fan, Austin, TX (US)

(73) Assignee: Marvell World Trade Ltd., St. Michael (BB)

( * ) Notice: Subject to any disclaimer, the term of this patent is extended or adjusted under 35 U.S.C. 154(b) by 97 days.

(21) Appl. No.: 13/038,778

(22) Filed: Mar. 2, 2011

(65) Prior Publication Data

US 2011/0217945 A1    Sep. 8, 2011

Related U.S. Application Data

(60) Provisional application No. 61/309,810, filed on Mar. 2, 2010.

(51) Int. Cl.
*H04B 1/26* (2006.01)

(52) U.S. Cl.
USPC ........... 455/323; 455/313; 455/333; 455/334; 455/318; 331/117 R; 331/167

(58) Field of Classification Search
USPC ...... 455/323, 313, 334, 333, 318; 331/117 R, 331/167
See application file for complete search history.

(56) References Cited

U.S. PATENT DOCUMENTS

| | | | |
|---|---|---|---|
| 5,128,630 A | 7/1992 | Mijuskovic | |
| 5,434,538 A | 7/1995 | Lee et al. | |
| 6,040,732 A | 3/2000 | Brokaw | |
| 6,535,725 B2 * | 3/2003 | Hatcher et al. | 455/317 |
| 7,643,847 B2 | 1/2010 | Daanen et al. | |
| 7,877,075 B1 * | 1/2011 | Jin et al. | 455/313 |

FOREIGN PATENT DOCUMENTS

WO    WO2010019163    2/2010

OTHER PUBLICATIONS

PCT International Search Report, Application No. PCT/US2011/026813, May 3, 2011.

* cited by examiner

*Primary Examiner* — Sanh Phu (57) ABSTRACT

A circuit includes first and second transconductance stages each having an input to receive a signal, and a current combiner circuit coupled to outputs of the first and second transconductance stages. The current combiner circuit forms a path from the first transconductance stage to (i) one of a plurality of output paths or (ii) multiple output paths of the output paths. The current combiner circuit severs the second transconductance stage from the output paths when the first transconductance stage forms a path to one of the output paths. The current combiner circuit forms a path from the second transconductance stage to the multiple output paths when the first transconductance stage forms a path to the multiple output paths. The current combiner circuit couples current from the first transconductance stage to (i) a first output path or a second output path or (ii) both the first and second output paths.

17 Claims, 5 Drawing Sheets

ND METHODS

CROSS REFERENCE TO RELATED APPLICATIONS

The present disclosure claims the benefit of priority from U.S. Provisional Application No. 61/309,810, filed Mar. 2, 2010, the disclosure of which is incorporated herein by reference in its entirety.

BACKGROUND

The present disclosure relates to dual carrier amplifier circuits and methods.

Unless otherwise indicated herein, the approaches described in this section are not prior art to the claims in this application and are not admitted to be prior art by inclusion in this section.

Amplifier circuits are basic building blocks of many electronic systems. Amplifier circuits (or "amplifiers") are used to increase a particular characteristic of a signal, such as voltage, current, or power, for example. One type of amplifier is the transconductance amplifier. In a transconductance amplifier, an input voltage signal is converted into a current output signal. The relationship between the input voltage signal and current output signal is the transconductance ("Gm") of the amplifier. Transconductance is described by the following equation:

$$Io = Vin*Gm$$

One issue with transconductance amplifiers is the variation of amplifier characteristics across different loads. For example, different loads may draw different amounts of current from the output of the transconductance amplifier, thereby changing the characteristics of the amplifier.

Wireless receivers use low noise amplifiers ("LNAs") to amplify radio frequency ("RF") signals received from an antenna. In some wireless applications, an RF signal may include multiple channels with multiple carrier frequencies. To process such signals, an LNA may send the amplified RF signal to different signal paths. If a transconductance amplifier were used for the LNA, the different signal paths would alter the loading on the transconductance amplifier output, thereby resulting in signal degradation and a reduced signal-to-noise ratio ("SNR").

Particular embodiments described below provide improved amplifiers for driving different signal paths. Particular embodiments further provide processing for dual or multi-carrier signals, such as in a wireless receiver.

SUMMARY

Embodiments of the present disclosure include dual carrier amplifier circuits and methods. One embodiment includes a circuit comprising a first transconductance stage having an input to receive a signal, a second transconductance stage having an input to receive the signal, and a current combiner circuit coupled to an output of the first transconductance stage and an output of the second transconductance stage. The current combiner circuit forms a path from the first transconductance stage to (i) one of a plurality of output paths or (ii) multiple output paths of the plurality of output paths. The current combiner circuit severs the second transconductance stage from the plurality output paths when the first transconductance stage forms a path to one of the plurality of output paths. The current combiner circuit forms a path from the second transconductance stage to multiple output paths when the first transconductance stage forms a path to multiple output paths.

In one embodiment, the current combiner circuit couples current from the first transconductance stage to (i) one of a first output path or a second output path or (ii) both the first output path and second output path. Additionally, the current combiner circuit decouples current from the second transconductance stage to both the first output path and second output path when the first transconductance stage couples current to one of the first output path or the second output path. Further, the current combiner circuit couples current from the second transconductance stage to both the first output path and the second output path when the first transconductance stage couples current to both the first output path and the second output path.

In one embodiment, the current combiner circuit comprises cascode transistors configured between the output of the second transconductance stage and the first output path and the second output path.

In one embodiment, the first transconductance stage further comprises a first inductance configured between the source of the first transistor and a reference voltage and a second inductance configured between the source of the second transistor and the reference voltage.

In one embodiment, the signal is an RF signal.

In one embodiment, the input of the first transconductance stage and the input of the second transconductance stage are coupled to an antenna.

Another embodiment includes an apparatus comprising an RF receiver, wherein the RF receiver comprises one or more circuits having multiple transconductance stages and current combiner circuits as described herein. In one embodiment, the one or more multi-transconductance circuits are a plurality of low noise amplifiers. The RF receiver further comprising a first down conversion circuit, the first down conversion circuit having a first input coupled to each of the low noise amplifiers and a second input coupled to receive a first oscillating signal having a first frequency, and a second down conversion circuit, the second down conversion circuit having a first input coupled to each of the low noise amplifiers and a second input coupled to receive a second oscillating signal having a second frequency.

Another embodiment includes a method comprising receiving a signal in a first transconductance stage, receiving the signal in a second transconductance stage, and forming paths from the first transconductance stage and the second transconductance stage to (i) one of a plurality of output paths or (ii) multiple output paths of the plurality of output paths. The second transconductance stage is severed from the plurality output paths when the first transconductance stage forms a path to one of the plurality of output paths. Further, the second transconductance stage forms a path to the multiple output paths of the plurality of output paths when the first transconductance stage forms the path to the multiple output paths of the plurality of output paths.

In one embodiment, current from the first transconductance stage is coupled to (i) one of a first output path or a second output path or (ii) both the first output path and second output path, and current from the second transconductance stage is decoupled from both the first output path and the second output path when the first transconductance stage couples current to one of the first output path or the second output path. Additionally, current is coupled from the second transconductance stage to both the first output path and the second output path when the first transconductance stage couples current to both the first output path and the second output path.

In one embodiment, current combining comprises selectively enabling cascode transistors configured between the output of the second transconductance stage and the first output path and the second output path.

In one embodiment, current combining comprises selectively enabling cascode transistors configured between the output of the first transconductance stage and the first output path and the second output path to selectively couple current from the first transconductance stage to (i) the first output path or the second output path or (ii) both the first output path and the second output path.

In one embodiment, the signal is a differential RF voltage signal, and the method further comprises converting first and second differential components of the RF signal to first and second currents in corresponding first and second differential transistors, converting the first and second differential components of the RF signal to third and fourth currents in corresponding third and fourth differential transistors, selectively coupling the first current through a fifth transistor and the third current through a sixth transistor to a first output path, and selectively coupling the second current through a seventh transistor and the fourth current through a eighth transistor to a second output path.

In one embodiment, the signal is an RF signal, and the RF signal is received by the first transconductance stage and the second transconductance stage from an antenna.

The following detailed description and accompanying drawings provide a better understanding of the nature and advantages of the present invention.

DETAILED DESCRIPTION

Described herein are techniques for dual carrier amplifier circuits and methods. In the following description, for purposes of explanation, numerous examples and specific details are set forth in order to provide a thorough understanding of particular embodiments. The circuits and methods disclosed herein may be used in a variety of electronic systems. Further, the circuits and methods describe herein may be implemented on an integrated circuit (IC). Particular embodiments as defined by the claims may include some or all of the features in these examples alone or in combination with other features described below, and may further include modifications and equivalents of the features and concepts described herein.

Figure 1:
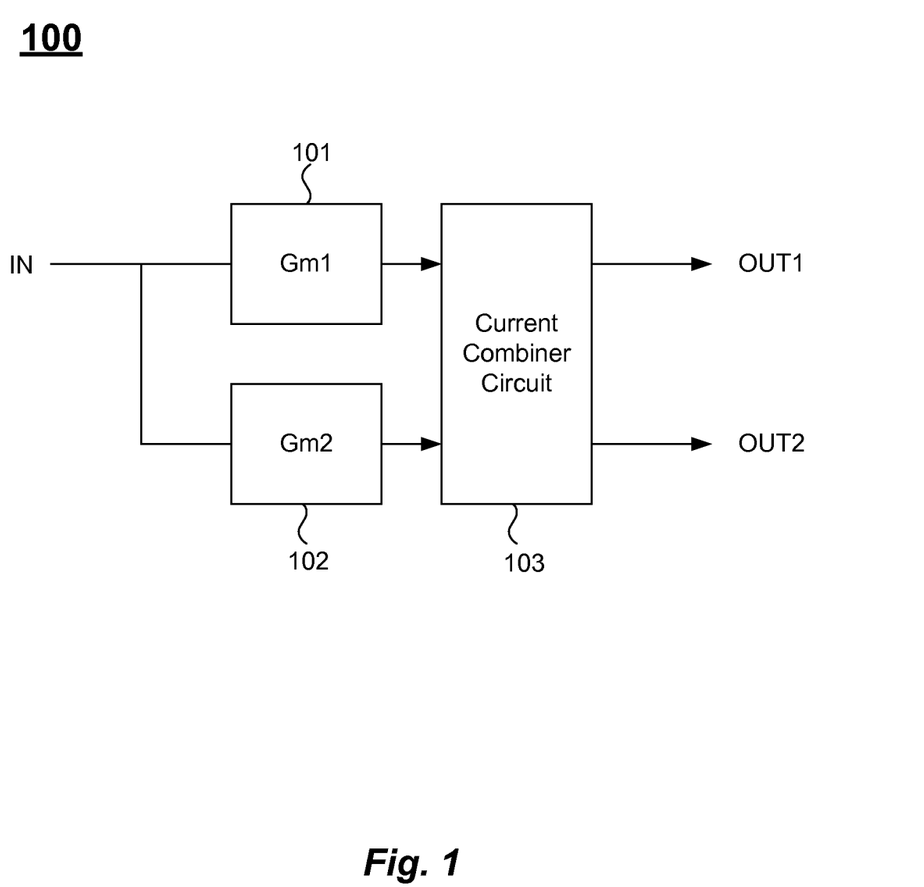
FIG. 1 illustrates an amplifier circuit according to one embodiment.

FIG. 1 illustrates an amplifier circuit 100 according to one embodiment. Amplifier circuit 100 includes a transconductance stage 101, transconductance stage 102, and a current combiner circuit 103. Transconductance stages receive an input voltage and generate an output current. Transconductance stages are commonly referred to as "Gm stages," where "gm" is the transconductance (or voltage-to-current gain) of the stage. Accordingly, in FIG. 1, transconductance stage 101 is labeled "Gm1" and transconductance stage 102 is labeled "Gm2." Transconductance stages 101 and 102 have inputs to receive a signal "IN." The IN signal may be an RF signal from an antenna, for example, as described in more detail below.

Current combiner circuit 103 is coupled to an output of transconductance stage 101 and to an output of transconductance stage 102. Current combiner circuit 103 couples current from the transconductance stages to different output paths (e.g., OUT1 and/or OUT2). In some applications, it may be desirable to send an output signal from amplifier circuit 100 to only output path OUT1 under some conditions, only output path OUT2 under other conditions, or to multiple output paths OUT1 and OUT2 under yet other conditions. Current combiner circuit 103 may selectively couple current from the different transconductance stages 101 and 102 to maintain consistent circuit characteristics, such as gain, across different output loads.

For example, current combiner circuit 103 may be configured to couple current from transconductance stage 101 to one of output path OUT1 or output path OUT2 or both output path OUT1 and output path OUT2. To maintain consistent circuit characteristics, when transconductance stage 101 couples current to one of output path OUT1 or output path OUT2, current combiner circuit 103 decouples current from transconductance stage 102 from both output path OUT1 and output path OUT2. Accordingly, in single carrier mode, for example, transconductance stage 101 is on and transconductance stage 102 is off, and transconductance stage 101 couples current to OUT1 or OUT2.

However, in one embodiment, transconductance stage 101 couples current to both output path OUT1 and output path OUT2. In this case, which may be a dual carrier mode, current combiner circuit 103 compensates for the additional loading by coupling current from transconductance stage 102 to both output path OUT1 and output path OUT2. In another embodiment, in dual carrier mode, for example, both transconductance stages 101 and 102 are on, and transconductance stage 101 drives either OUT1 or OUT2 and transconductance stage 102 drives the output path not driven by transconductance stage 101.

By incorporating one or more additional "Gm" stages when driving multiple output paths, the performance of the amplifier circuit 100 may be maintained across different output loads. Specifically, when driving two output paths simultaneously, a second transconductance stage is enabled to maintain substantially similar gain, Noise Figure ("NF"), linearity, and input impedance matching. In this example, the current generated by amplifier circuit is increased by approximately two-times (2×) when driving both output paths OUT1 and OUT2. However, when current combiner circuit 103 is configured to couple current from transconductance stage 101 to one of output path OUT1 or output path OUT2, second transconductance state 102 may be turned off. Accordingly, in this configuration performance is similar to single output LNA and current is saved since the second transconductance stage 102 is turned off. As illustrated in an example below, cascode devices may be turned off to disconnect current from transconductance stage 102 to OUT1 and OUT2, for example. Further, transconductance stage 101 may provide input matching. An example of input matching is described below.

Figure 2A:
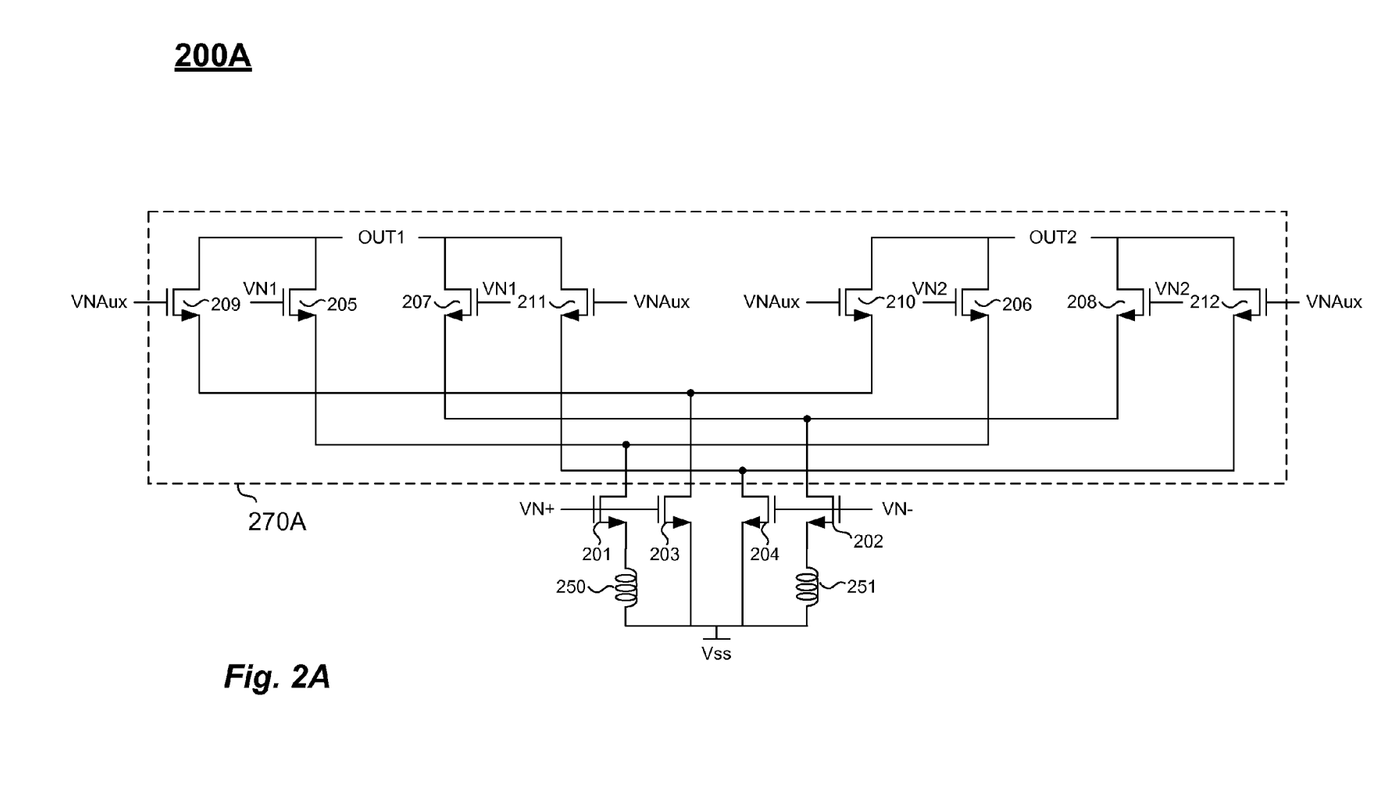
FIG. 2A shows an amplifier circuit according to one embodiment.

FIG. 2A shows an amplifier circuit 200A according to one embodiment. Amplifier circuit 200A is an NMOS LNA architecture with selectively enabled cascode output transistors that route currents to either or both of output paths OUT1 and OUT2. While an NMOS example is shown in FIG. 2A, it is to be understood that PMOS implementations are also possible. Amplifier circuit 200A includes input transistors 201-204 that act as parallel transconductance stages. For instance, gates of transistors 201 and 202 receive a differential signal having a first component VN+ and a second component VN−, respectively. Sources of transistors 201 and 202 are coupled to a reference voltage (Vss) through inductors 250 and 251, respectively. Transistors 201 and 202 convert VN+ and VN− to corresponding currents that are output on the drains of transistors 201 and 202. Transistors 201-202 make up one transconductance stage to convert a differential input signal into corresponding currents. Inductors 250-251 provide source degeneration and input matching to external filters, for example. Inductors 250-251 may be a single inductor with a center tap, for example.

Analogously, gates of transistors 203 and 204 may receive the differential signal VN+ and VN−. Sources of transistors 203 and 204 are coupled to a reference voltage (Vss). Transistors 203 and 204 convert VN+ and VN− to corresponding currents that are output on the drains of transistors 203 and 204. Transistors 203-204 make up another transconductance stage to convert the differential input signal into corresponding currents.

In this example, currents from the transconductance stages are received by a current combiner circuit 270A. Current combiner circuit 270A is implemented with selectively enabled cascode NMOS transistors 205-212 to selectively couple currents from the transconductance stage transistors to either or both of output paths OUT1 and OUT2. Transistors 205-206 have sources coupled to transistor 201. The drain of transistor 205 is coupled to output path OUT1 and the drain of transistor 206 is coupled to output path OUT2. Similarly, transistors 207-208 have sources coupled to transistor 202. The drain of transistor 207 is coupled to output path OUT1 and the drain of transistor 208 is coupled to output path OUT2. Cascode transistors 205 and 207 may be selectively turned on or off by controlling voltage VN1 at the gate of transistor 205 and the gate of transistor 207, thereby coupling or decoupling current from transistors 201 and 202 from output path OUT1. Likewise, cascode transistors 206 and 208 may be selectively turned on or off by controlling voltage VN2 at the gate of transistor 206 and the gate of transistor 208, thereby coupling or decoupling current from transistors 201 and 202 from output path OUT2.

Current from the other transconductance stage transistors 203-204 may be similarly routed to the output paths OUT1 and OUT2. In this example, transistors 209-210 have sources coupled to transistor 203. The drain of transistor 209 is coupled to output path OUT1 and the drain of transistor 210 is coupled to output path OUT2. Similarly, transistors 211-212 have sources coupled to transistor 204. The drain of transistor 211 is coupled to output path OUT1 and the drain of transistor 212 is coupled to output path OUT2.

Particular embodiments couple current from transconductance stage transistors 203-204 to both output paths OUT1 and OUT2 when the amplifier circuit is configured to provide an output on both output paths OUT1 and OUT2. Accordingly, in this example, cascode transistors 209-212 may be selectively turned on or off together by controlling voltage VNAux at the gate of each transistor 209-212, thereby coupling or decoupling current from transistors 203 and 204 to or from output path OUT1 and output path OUT2.

Specifically, transconductance stage transistors 201-202 may be configured to couple current to both output paths OUT1 and OUT2 by providing VN1 and VN2 to turn on transistors 205-208. In this configuration, VNAux is provided to turn on transistors 209-212 so that transconductance stage transistors 203-204 provides current to both output paths OUT1 and OUT2.

Alternatively, VN1 and VN2 may be configured to selectively couple current from transistors 201-202 to either one of output path OUT1 or OUT2 (e.g., but not both). When only one output path is coupled to the transconductance stage transistors 201-202, NVAux is configured to turn off transistors 209-212 to decouple current from transconductance transistors 203-204 from output paths OUT1 and OUT2.

Figure 2B:
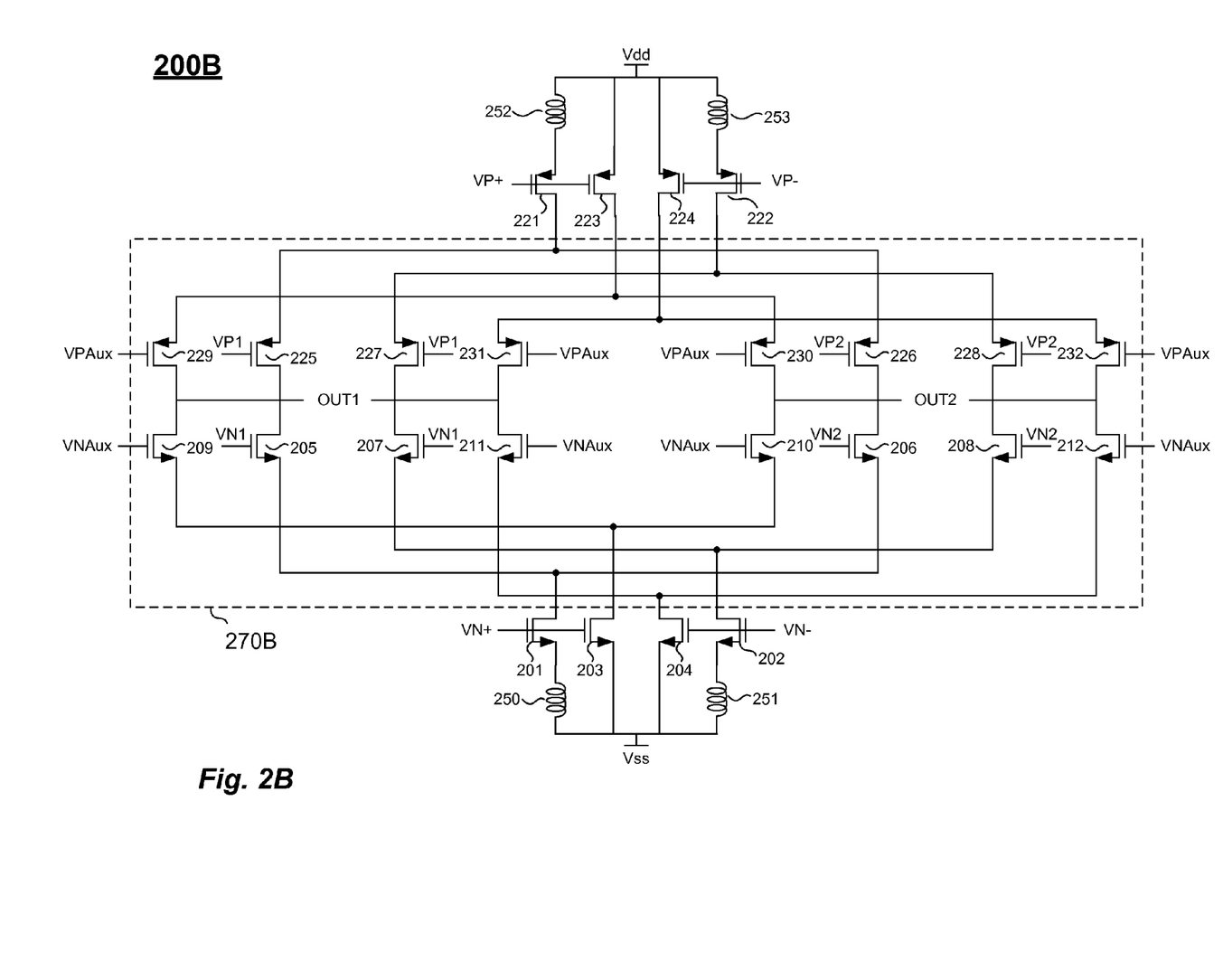
FIG. 2B shows an amplifier circuit according to one embodiment.

FIG. 2B shows an amplifier circuit 200B according to one embodiment. Amplifier circuit 200B is a "push-pull" LNA architecture with selectively enabled cascode output transistors that route currents to either or both of output paths OUT1 and OUT2. Amplifier circuit 200B includes NMOS transistors 201-212 as described in FIG. 2A. Amplifier circuit 200B further includes PMOS transistors 221-232. Input transistors 221-224 that act as parallel transconductance stages. For instance, gates of transistors 221 and 222 receive a differential signal having a first component VP+ and a second component VP−, respectively. Sources of transistors 221 and 222 are coupled to a reference voltage (Vdd) through inductors 252 and 253, respectively. Transistors 221 and 222 convert VP+ and VP− to corresponding currents that are output on the drains of transistors 221 and 222.

Transistors 221-222 make up one transconductance stage to convert a differential input signal into corresponding currents. Inductors 252-253 provide source degeneration and input matching for the circuit as described above with reference to inductors 250 and 251. Inductors 252-253 may be a single inductor with a center tap, for example. Analogously, gates of transistors 223 and 224 receive VP+ and VP−. Sources of transistors 223 and 224 are coupled to a reference voltage (Vdd). Transistors 223 and 224 convert VP+ and VP− to corresponding currents that are output on the drains of transistors 223 and 224. Transistors 223-224 make up another transconductance stage to convert the differential input signal into corresponding currents.

Currents from the NMOS and PMOS transconductance stages are received by a current combiner circuit 270B. In this example, current combiner circuit 270B is implemented with selectively enabled cascode NMOS transistors 205-212 as described in FIG. 2A and cascode PMOS transistors 225-232 to selectively couple currents from the transconductance stage transistors to either or both of output paths OUT1 and OUT2. In this example, current from transistors 221 and 222 is selectively routed to different output paths OUT1 and OUT2 using cascode transistors 225-228. For example, transistors 225-226 have sources coupled to transistor 221. The drain of transistor 225 is coupled to output path OUT1 and the drain of transistor 226 is coupled to output path OUT2. Similarly, transistors 227-228 have sources coupled to transistor 222. The drain of transistor 227 is coupled to output path OUT1 and the drain of transistor 228 is coupled to output path OUT2. Cascode transistors 225 and 227 may be selectively turned on or off by controlling voltage VP1 at the gate of transistor 225 and the gate of transistor 227, thereby coupling or decoupling current from transistors 221 and 222 from output path OUT1. Likewise, cascode transistors 226 and 228 may be selectively turned on or off by controlling voltage VP2 at the gate of transistor 226 and the gate of transistor 228, thereby coupling or decoupling current from transistors 221 and 222 from output path OUT2.

Current from the other PMOS transconductance stage transistors 223-224 may be similarly routed to the output paths OUT1 and OUT2. In this example, transistors 229-230 have sources coupled to transistor 223. The drain of transistor 229 is coupled to output path OUT1 and the drain of transistor 230 is coupled to output path OUT2. Similarly, transistors 231-232 have sources coupled to transistor 224. The drain of transistor 231 is coupled to output path OUT1 and the drain of transistor 232 is coupled to output path OUT2.

Particular embodiments couple current from transconductance stage transistors 203-204 and 223-224 to both output paths OUT1 and OUT2 when the amplifier circuit is configured to provide an output on both output paths OUT1 and OUT2. Accordingly, in this example, cascode transistors 209-212 may be selectively turned on or off together by controlling voltage VNAux at the gate of each transistor 209-212 as described above with regard to FIG. 2A. Likewise, cascode transistors 229-232 may be selectively turned on or off together by controlling voltage VPAux at the gate of each transistor 229-232, thereby coupling or decoupling current from transistors 223 and 224 to or from output path OUT1 and output path OUT2. Transconductance stage transistors 221-222 may be configured to couple current to both output paths OUT1 and OUT2 by providing VP1 and VP2 to turn on transistors 225-228. In this configuration, VPAux is provided to turn on transistors 229-232 so that transconductance stage transistors 223-224 provides current to both output paths OUT1 and OUT2.

Alternatively, VP1 and VP2 may be configured to selectively couple current from transistors 221-222 to either one of output path OUT1 or OUT2 (e.g., but not both). When only one output path is coupled to the transconductance stage transistors 221-222, PNAux is configured to turn off transistors 229-232 to decouple current from transconductance transistors 223-224 from output paths OUT1 and OUT2.

Figure 3:
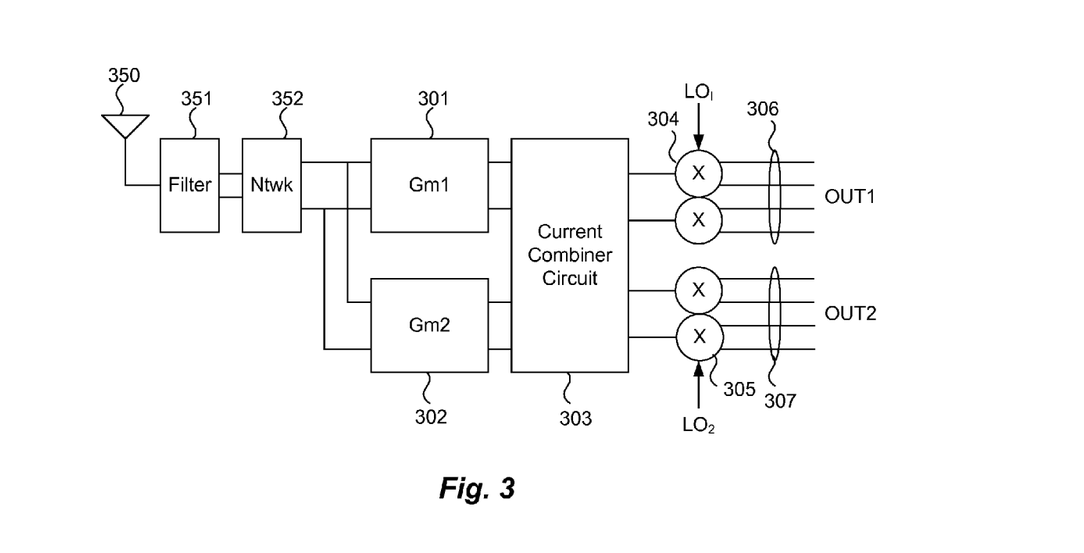
FIG. 3 shows another amplifier circuit according to one embodiment.

FIG. 3 shows another amplifier circuit according to one embodiment. In this example a low noise amplifier (LNA) includes two transconductance stages 301 and 302 and a current combiner circuit 303 that operate as described above. In this example, an RF signal is received on antenna 350. Antenna 350 is coupled to the inputs of transconductance stages 301 and 302 through a filter 351 and a matching network 352. The RF signal may include two channels encoded around two different carrier frequencies (i.e., dual carriers), for example. The dual carrier signal may be amplified by transconductance stages 301 and 302 and coupled to two mixers 304 and 305 on two different output paths by current combiner circuit 303. Mixer 304 may receive the dual carrier signal and a local oscillator signal having a frequency equal to one of the two carriers in the RF signal (i.e., $LO_1$). Accordingly, mixer 304 down converts one of the channels of the RF signal to baseband. Similarly, mixer 305 may receive the dual carrier signal and another local oscillator signal having another frequency equal to the other of the two carriers in the RF signal (i.e., $LO_2$). Accordingly, mixer 305 down converts the other channel of the RF signal to baseband. In this example, mixers 304 and 305 are quadrature mixers having four outputs each. Mixer 304 outputs differential in-phase (I) and quadrature (Q) signals on output path 306 (OUT1) and mixer 305 outputs differential I and Q signals on output path 307 (OUT2).

Figure 4:
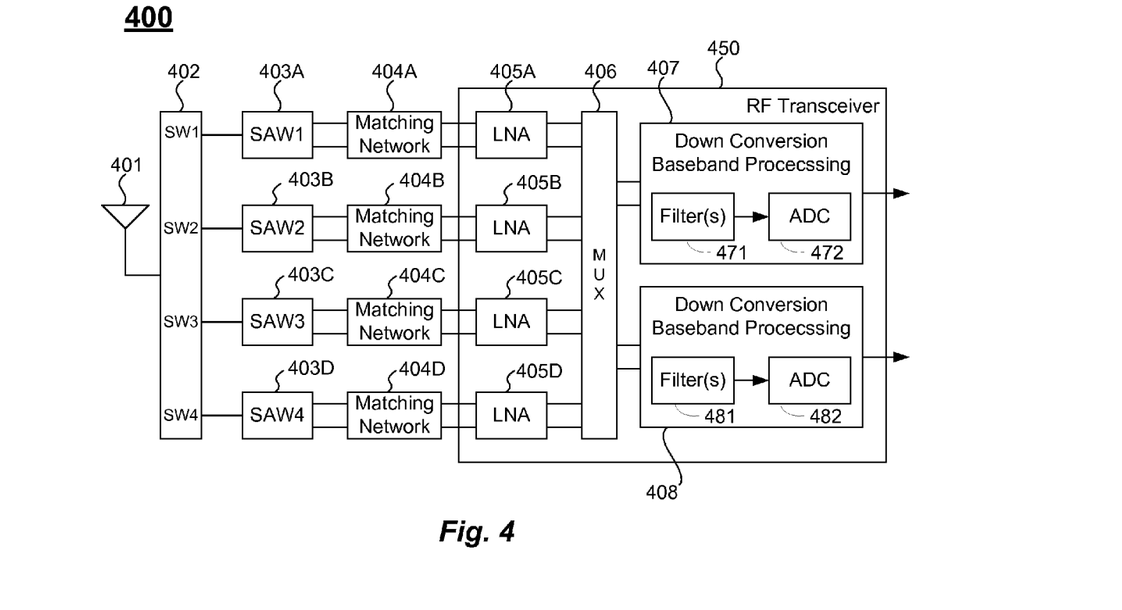
FIG. 4 shows an system using an amplifier circuit according to one embodiment.

FIG. 4 shows a system 400 using an amplifier circuit according to one embodiment. System 400 is an example of an implementation of an Evolved EDGE wireless system. Enhanced Data rates for GSM Evolution ("EDGE") (also known as Enhanced GPRS (EGPRS) or Enhanced Data rates for Global Evolution) is a digital mobile phone technology that enables data transmission across wireless networks such as GSM. In this example, system 400 includes an antenna 401 to receive a dual carrier RF signal. The RF signal is routed to one of four input channels using switches 402. Each input channel includes a filter 403A-D, such as a surface acoustic wave (SAW) filter, matching network 404A-D, and LNA 405A-D. Each LNA provides the appropriate input impedance match to the matching network and filters (e.g., 50 Ohms). For example, Gm1 of each LNA provides input matching to an external SAW filter. The four different channels depicted in FIG. 4 may correspond to GSM850, GSM900, DCS, and PCS technologies, for example, with each channel configured to support the particular dual carrier frequencies corresponding to each technology.

Outputs of LNAs 405A-D are multiplexed to two different down conversion and baseband processing circuits 407 and 408. Multiplexer ("MUX") 406 illustrates the selective coupling of LNA outputs to the two down converters using the current combiner circuits of each LNA as illustrated above, for example. Down conversion and baseband processing circuits 407 and 408 may include additional filters 471 and 481, respectively, and analog-to-digital converters (ADCs) 472 and 482, respectively, for translating the information in each channel of the RF signal into digital data. As illustrated in FIG. 4, the LNAs 405A-D and down conversion and baseband processing circuits 407-408 may be implemented on an RF transceiver integrated circuit 450, for example.

Figure 5:
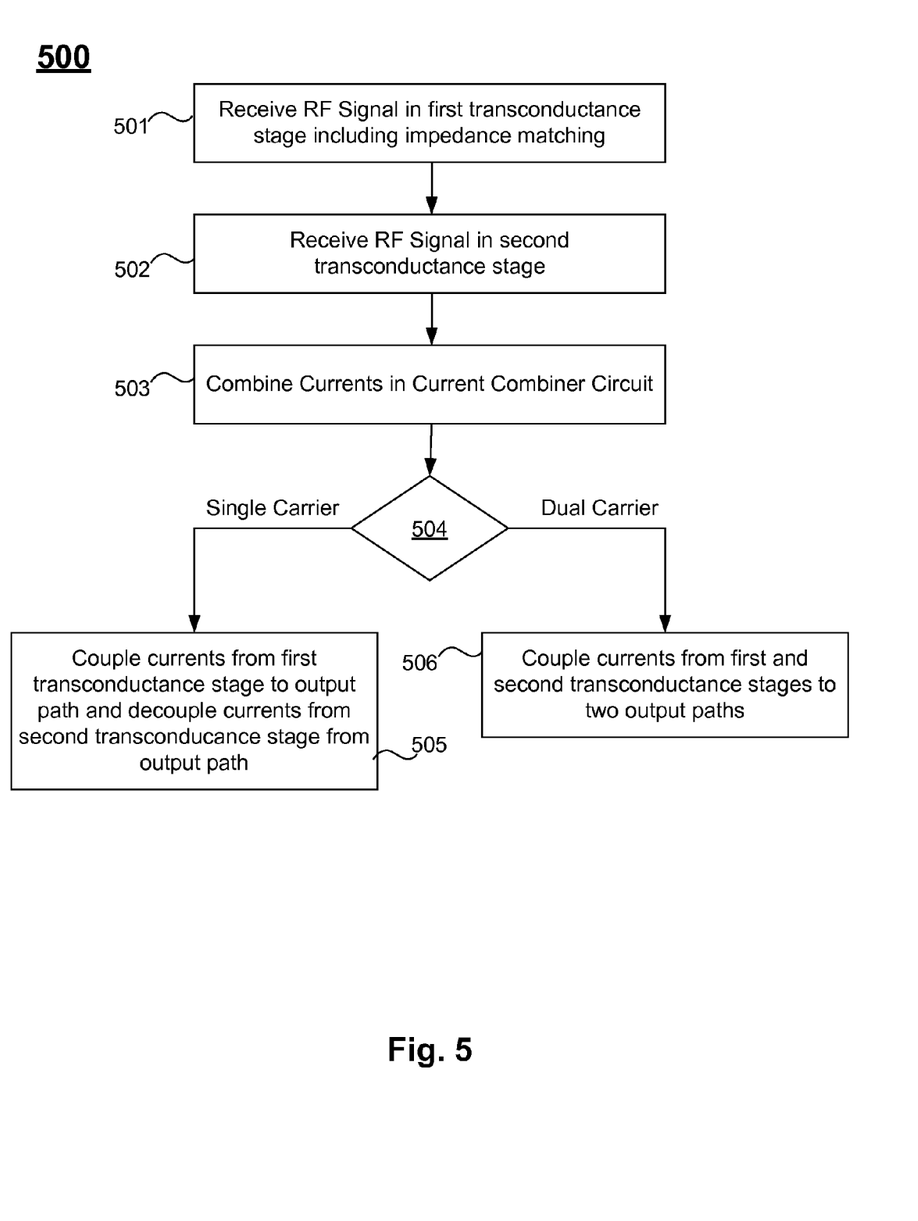
FIG. 5 illustrates a process according to one embodiment.

FIG. 5 illustrates a process according to one embodiment. At 501, an RF signal is received in a first transconductance stage. At 502, the RF signal is received in a second transconductance stage. At 503, the currents from the transconductance stage are combined in a current combiner circuit. The RF signal may include one or two channels (i.e., single or dual carrier) as illustrated at 504. If the RF signal is a single carrier, then the process couples currents from the first transconductance stage to a particular output path and decouples currents from the second transconductance stage from the particular output path at 505. As mentioned above, decoupling current may include turning the second transconductance stage off, for example. If the RF signal is a dual carrier, then the process couples currents from the first and second transconductance stages to two output paths for further processing at 506.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims.

For example, while the some of the above embodiments have been disclosed using PMOS and NMOS, other embodiments may use other types of transistors or only PMOS or only NMOS, for example. Further, while the examples provided above illustrate using two transconductance stages for two output paths, it is to be understood that other embodiments may include more transconductance stages for additional output paths.

As a further example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:
1. A circuit comprising:
a first transconductance stage having an input to receive a signal;
a second transconductance stage having an input to receive the signal; and a current combiner circuit coupled to an output of the first transconductance stage and an output of the second transconductance stage, wherein the current combiner circuit forms a path from the first transconductance stage to (i) one of a plurality of output paths or (ii) multiple output paths of the plurality of output paths, the current combiner circuit severs the second transconductance stage from the plurality of output paths when the first transconductance stage forms a path to one of the plurality of output paths, the current combiner circuit forms a path from the second transconductance stage to the multiple output paths of the plurality of output paths when the first transconductance stage forms a path to the multiple output paths of the plurality of output paths, the current combiner circuit couples current from the first transconductance stage to (i) one of a first output path or a second output path or (ii) both the first output path and second output path, the current combiner circuit decouples current from the second transconductance stage to both the first output path and second output path when the first transconductance stage couples current to one of the first output path or the second output path, and the current combiner circuit couples current from the second transconductance stage to both the first output path and the second output path when the first transconductance stage couples current to both the first output path and the second output path.

2. The circuit of claim 1, wherein the current combiner circuit comprises cascode transistors configured between the output of the second transconductance stage and the first output path and the second output path.

3. The circuit of claim 1, wherein the current combiner circuit comprises cascode transistors configured between the output of the first transconductance stage and the first output path and the second output path to selectively couple current from the first transconductance stage to (i) the first output path or the second output path or (ii) both the first output path and the second output path.

4. A circuit comprising:
a first transconductance stage having an input to receive a signal;
a second transconductance stage having an input to receive the signal; and
a current combiner circuit coupled to an output of the first transconductance stage and an output of the second transconductance stage, wherein the current combiner circuit forms a path from the first transconductance stage to (i) one of a plurality of output paths or (ii) multiple output paths of the plurality of output paths, the current combiner circuit severs the second transconductance stage from the plurality of output paths when the first transconductance stage forms a path to one of the plurality of output paths, the current combiner circuit forms a path from the second transconductance stage to the multiple output paths of the plurality of output paths when the first transconductance stage forms a path to the multiple output paths of the plurality of output paths, the first transconductance stage comprises:
a first transistor having a source, a gate, and a drain; and
a second transistor having a source, a gate, and a drain, the second transconductance stage comprises:
a third transistor having a source, a gate, and a drain; and
a fourth transistor having a source, a gate, and a drain, the gate of the first transistor and the gate of the third transistor are coupled together to receive a first component of the signal, the gate of the second transistor and the gate of the fourth transistor are coupled together to receive a second component of the signal, and the drain of the first transistor, the drain of the second transistor, the drain of the third transistor, and the drain of the fourth transistor are coupled to the current combiner circuit.

5. The circuit of claim 4, wherein the current combiner circuit comprises:
a fifth transistor having a source coupled to the drain of the first transistor;
a sixth transistor having a source coupled to the drain of the first transistor;
a seventh transistor having a source coupled to the drain of the second transistor;
an eighth transistor having a source coupled to the drain of the second transistor;
a ninth transistor having a source coupled to the drain of the third transistor;
a tenth transistor having a source coupled to the drain of the third transistor;
an eleventh transistor having a source coupled to the drain of the fourth transistor; and
a twelfth transistor having a source coupled to the drain of the fourth transistor.

6. The circuit of claim 5,
wherein the drain of the fifth transistor is coupled to the drain of the ninth transistor and a first terminal of a first output path,
wherein the drain of the seventh transistor is coupled to the drain of the eleventh transistor and a second terminal of the first output path,
wherein the drain of the sixth transistor is coupled to the drain of the tenth transistor and a first terminal of a second output path, and
wherein the drain of the eighth transistor is coupled to the drain of the twelfth transistor and a second terminal of the second output path.

7. The circuit of claim 4,
wherein the first transconductance stage further comprises:
a fifth transistor having a source, a gate, and a drain; and
a sixth transistor having a source, a gate, and a drain,
and wherein the second transconductance stage comprises:
a seventh transistor having a source, a gate, and a drain; and
an eighth transistor having a source, a gate, and a drain,
wherein the gate of the fifth transistor and the gate of the seventh transistor are coupled together to receive the first component of the signal,
wherein the gate of the sixth transistor and the gate of the eighth transistor are coupled together to receive the second component of the signal,
and wherein the drain of the fifth transistor, the drain of the sixth transistor, the drain of the seventh transistor, and the drain of the eighth transistor are coupled to the current combiner circuit.

8. The circuit of claim 4, wherein the first transconductance stage further comprises:
a first inductance configured between the source of the first transistor and a reference voltage; and a second inductance configured between the source of the second transistor and the reference voltage.

9. The circuit of claim 1, wherein the signal is an RF signal.

10. The circuit of claim 1, wherein the input of the first transconductance stage and the input of the second transconductance stage are coupled to an antenna.

11. An apparatus comprising an RF receiver, the RF receiver comprising:
a plurality of low noise amplifiers, each of the plurality of low noise amplifiers comprising
a first transconductance stage having an input to receive a signal;
a second transconductance stage having an input to receive the signal; and
a current combiner circuit coupled to an output of the first transconductance stage and an output of the second transconductance stage, wherein
the current combiner circuit forms a path from the first transconductance stage to (i) one of a plurality of output paths or (ii) multiple output paths of the plurality of output paths,
the current combiner circuit severs the second transconductance stage from the plurality of output paths when the first transconductance stage forms a path to one of the plurality of output paths, and
the current combiner circuit forms a path from the second transconductance stage to the multiple output paths of the plurality of output paths when the first transconductance stage forms a path to the multiple output paths of the plurality of output paths;
a first down conversion circuit, the first down conversion circuit having a first input coupled to each of the low noise amplifiers and a second input coupled to receive a first oscillating signal having a first frequency; and
a second down conversion circuit, the second down conversion circuit having a first input coupled to each of the low noise amplifiers and a second input coupled to receive a second oscillating signal having a second frequency.

12. The apparatus of claim 11, wherein the RF receiver is a multi-carrier EDGE receiver.

13. A method comprising:
receiving a signal in a first transconductance stage;
receiving the signal in a second transconductance stage; and
forming paths from the first transconductance stage and the second transconductance stage to (i) one of a plurality of output paths or (ii) multiple output paths of the plurality of output paths, wherein
the second transconductance stage is severed from the plurality of output paths when the first transconductance stage forms a path to one of the plurality of output paths, and
the second transconductance stage forms a path to the multiple output paths of the plurality of output paths when the first transconductance stage forms the path to the multiple output paths of the plurality of output paths,
forming paths comprises combining currents from the first transconductance stage and second transconductance stage,
current from the first transconductance stage is coupled to (i) one of a first output path or a second output path or (ii) both the first output path and second output path,
current from the second transconductance stage is decoupled from both the first output path and the second output path when the first transconductance stage couples current to one of the first output path or the second output path, and
current is coupled from the second transconductance stage to both the first output path and the second output path when the first transconductance stage couples current to both the first output path and the second output path.

14. The method of claim 13, wherein combining currents from the first transconductance stage and second transconductance stage comprises selectively enabling cascode transistors configured between the output of the second transconductance stage and the first output path and the second output path.

15. The method of claim 13, wherein combining currents from the first transconductance stage and second transconductance stage comprises selectively enabling cascode transistors configured between the output of the first transconductance stage and the first output path and the second output path to selectively couple current from the first transconductance stage to (i) the first output path or the second output path or (ii) both the first output path and the second output path.

16. A method comprising:
receiving a signal in a first transconductance stage;
receiving the signal in a second transconductance stage; and
forming paths from the first transconductance stage and the second transconductance stage to (i) one of a plurality of output paths or (ii) multiple output paths of the plurality of output paths, wherein
the second transconductance stage is severed from the plurality of output paths when the first transconductance stage forms a path to one of the plurality of output paths,
the second transconductance stage forms a path to the multiple output paths of the plurality of output paths when the first transconductance stage forms the path to the multiple output paths of the plurality of output paths, and
the signal is a differential RF signal;
converting first and second differential components of the RF signal to first and second currents in corresponding first and second differential transistors;
converting the first and second differential components of the RF signal to third and fourth currents in corresponding third and fourth differential transistors;
selectively coupling the first current through a fifth transistor and the third current through a sixth transistor to a first output path; and
selectively coupling the second current through a seventh transistor and the fourth current through an eighth transistor to a second output path.

17. The method of claim 13, wherein the signal is an RF signal, and wherein the RF signal is received by the first transconductance stage and the second transconductance stage from an antenna.

* * * * *